D

United States Patent [19]

Saito

[11] Patent Number: 5,773,853
[45] Date of Patent: Jun. 30, 1998

[54] COMPOUND SEMICONDUCTOR DEVICE

[75] Inventor: Junji Saito, Yamanashi, Japan

[73] Assignees: Fujitsu Ltd., Kanagawa; Fujitsu Quantum Devices Ltd., Yamanashi, both of Japan

[21] Appl. No.: 701,666

[22] Filed: Aug. 22, 1996

Related U.S. Application Data

[63] Continuation of Ser. No. 320,379, Oct. 11, 1994, abandoned, which is a continuation of Ser. No. 109,512, Aug. 20, 1993, abandoned.

[30] Foreign Application Priority Data

Feb. 26, 1993 [JP] Japan .................................. 5-038794

[51] Int. Cl.[6] ...................... H01L 29/06; H01L 31/0328; H01L 31/0336
[52] U.S. Cl. ............................... 257/192; 257/18; 257/20
[58] Field of Search ................................ 257/18, 15, 20, 257/192, 194, 24, 26, 27, 29

[56] References Cited

U.S. PATENT DOCUMENTS

| | | | |
|---|---|---|---|
| 4,558,336 | 12/1985 | Chang et al. | 257/18 |
| 4,952,527 | 8/1990 | Calawa et al. | 437/107 |
| 5,023,675 | 6/1991 | Ishikawa | 257/194 |
| 5,105,241 | 4/1992 | Ando | 257/194 |
| 5,146,295 | 9/1992 | Imanaka et al. | 257/22 |
| 5,166,766 | 11/1992 | Grudkowski et al. | 257/15 |
| 5,285,087 | 2/1994 | Narita et al. | 257/194 |
| 5,343,057 | 8/1994 | Gerard et al. | 257/194 |
| 5,389,806 | 2/1995 | Hickernell et al. | 257/239 |

FOREIGN PATENT DOCUMENTS

| | | | |
|---|---|---|---|
| 63-278277 | 11/1988 | Japan | 257/20 |
| 2-52441 | 2/1990 | Japan . | |

OTHER PUBLICATIONS

"A 0.1–ym A1IN As/GaIn As MODFET Fabricated on GaAs Substrates"; Wang et al, IEEE Electron Devices, vol. 35 No. 7, Jul. 1988.

"Arsenic Precipitates and the Semi–insulating Properties of GaAs Buffer Layers Grown by LTMBE"; Warren et al; App. Phys. Lett. 57(13) 1990; pp. 1331–1333.

Govind P. Agrawal et al., "Semiconductor Lasers", pp. 162–179.

L. Nguyen, a. Brown, M. Delaney, U. Mishra, L. Larason, L. Tellosian, M. Melendes, C. Hooper and M. Thomson, Tech, Dig., IEDEM 89 (IEEE, New York, 1989, p. 105.

Technical Report and Research, ED 88–94 (1988), pp. 9–14.

"Extremely High Gain 0.15 $\mu$m Gate–Length InAlAs/InGaAs/InP HEMTs," P. Ho et al., Electronics Letters, vol. 27, No. 4 (1991), pp. 325–327.

"$In_{0.52}Al_{0.48}AS/IN_{0.53}Ga_{0.47}As$ Heterojunction Bipolar Transistor on GaAs by Molecular Beam Expitaxy," T. Won et al., App. Phys. Letters 53 (23) (1988), pp. 2311–2313.

"A 0.1–$\mu$m Gate $Al_{0.5}In_{0.5}As/Ga_{0.5}As$ MODFET Fabricated on GaAs Substrates," G. U. Wang et al., IEEE Trans. Electron Devices, vol. 35, No. 7 (1988) pp. 818–823.

*Primary Examiner*—Wael Fahmy
*Attorney, Agent, or Firm*—Staas & Halsey

[57] ABSTRACT

On a compound semiconductor substrate on which a compound semiconductor device is formed, a film having a multilayer structure formed by alternately depositing a multi-element compound semiconductor layer and a GaAs layer containing arsenic excessively deviating from a stoichiometric ratio repeatedly and an active layer deposited on said film having a multilayer structure are formed.

When the thickness of the GaAs layer is made to a critical film thickness or less, even if the GaAs layer and the multi-element compound semiconductor layer have different lattice constants, the strain of lattice mismatch is confined in the vicinity of the interface, and a high resistance is achieved while maintaining a crystal of high quality as it is.

10 Claims, 6 Drawing Sheets

COMPOUND SEMICONDUCTOR DEVICE

This application is a continuation of application Ser. No. 08/320,379, filed Oct. 11, 1994, now abandoned, which is a continuation of application Ser. No. 08/109,512, filed Aug. 20, 1993, now abandoned.

BACKGROUND OF THE INVENTION

1. Field of the Invention

The present invention relates to a compound semiconductor device and a method of manufacturing the same, and more particularly to a compound semiconductor device including an element such as a HEMT, a MESFET and a MISFET formed on a compound semiconductor crystal substrate and a method of manufacturing the same.

2. Description of the Related Art

A new electronic device and a new optical device are realized by growing an epitaxial film on a semiconductor crystal substrate and forming the epitaxial film into a multilayer or a heterostructure.

According to an AlGaAs/GaAs heterostructure obtained by growing an AlGaAs layer doped with silicon (Si) on a GaAs layer, an energy gap is produced at an interface, and two-dimensional electron gas (hereinafter referred to as 2DEG) having high electron mobility is formed on the side of the GaAs layer at the interface.

There is a high electron mobility transistor (HEMT) as a field effect transistor (FET) utilizing the 2DEG for a channel layer.

The HEMT is one of the new electron devices realized by using a multilayer heterostructure and epitaxial growth techniques. It has been put to practical use as an amplifier of a receiver used for satellite communication and satellite broadcasting by making the most of low noise characteristics thereof.

Incidentally, as to the HEMT, an n-AlGaAs/GaAs heterostructure was adopted at the beginning as described above, but a heterostructure composed of a new structure or a new material is under development recently in order to further increase the concentration of 2DEG and further improve the low noise characteristics.

For example, a structure in which an InGaAs layer is inserted in a thickness at a critical layer thickness or less at the interface of n-AlGaAs/GaAs having a heterostructure has been proposed in U.S. Pat. No. 4,827,320.

In this case, since the crystal of InGaAs has larger electron affinity as compared with GaAs, the AlGaAs/InGaAs/GaAs heterostructure shows a larger discontinuous width at a conduction band end of energy bands of respective layers as compared with AlGaAs/GaAs heterostructure. As a result, it becomes possible to set the concentration of 2DEG to approximately twice as large as that of n-AlGaAs/GaAs.

In such an n-AlGaAs/InGaAs/GaAs heterostructure, the 2DEG concentration of $2 \times 10^{12}$ cm$^{-2}$ is obtainable by setting the composition of InAs in InGaAs to approximately 0.2 and the film thickness thereof to approximately 15 nm.

It has been known that the increase of the 2DEG concentration is effective for improving low noise characteristics, i.e., a noise factor (NF) of a HEMT.

Further, it is introduced in the following documents:

① L. Nguyen, A. Brown, M. Delaney, U. Mishra, L. Larason, L. Telloian, M. Melendes, C. Hooper and M. Thompson, Tech. Dig., IEDM 89 (IEEE, New York, 1989) 105, and ② P. Ho et al. Electronics Letters 27(4) (1991) 325, to adopt an n-InAlAs/InGaAs heterostructure obtained by growing an InAlAs layer doped with Si on an InGaAs layer as a structure for improving low noise characteristics of a HEMT.

According to this n-InAlAs/InGaAs heterostructure, 2DEG characteristics are improved further as compared with the n-AlGaAs/InGaAs/GaAs heterostructure. However, the InAlAs/InGaAs heterostructure disclosed in those documents is a material system in a lattice-match state on an InP substrate.

Other than the InP substrate, it is also being attempted that a GaAs substrate which is less expensive than the InP substrate and in which thermal cleaning processing of the surface before epitaxial crystal growth is easy is adopted, and an n-InAlAs/InGaAs heterostructure is grown thereon. This is introduced in the following documents.

③ T. Won et al., Appl. Phys. Letters 53(1988) 2311, and

④ G. U. Wang et al., IEEE Trans Electron Devices ED-35(1988) 818.

When an In-system material is formed on a GaAs substrate, it is required to change the composition of a buffer layer or to introduce a multilayer structure since lattice mismatch thereof is large.

Now, what becomes a problem in the characteristics of a compound semiconductor element such as a HEMT is that the resistance of the buffer layer is low both in the GaAs substrate and the InP substrate. With this, the characteristics of the FET are not improved, and moreover, the effect of causing interference among elements on the same substrate, i.e., the side gate effect cannot be restrained.

In order to improve FET characteristics and reduce the side gate effect, it is required to obtain the sheet resistance of the buffer layer at $1 \times 10^8$ $\Omega$/cm$^2$ or higher.

In the InAlAs/InGaAs heterostructure grown on the InP substrate, however, the InGaAs layer becomes a buffer layer basically, but only the sheet resistance of approximately $1 \times 10^5$ $\Omega$/cm$^2$ is obtainable in the InGaAs layer.

As against the above, it has been proposed in Japanese Patent Provisional Publication Number 2-52441 and U.S. Pat. No. 4,952,527 that a GaAs layer of a high resistance single layer containing a large quantity of arsenic is formed on a semi-insulating GaAs substrate and a compound semiconductor element is formed thereon.

In a GaAs layer containing a large quantity of arsenic, however, crystal defects are liable to be produced as compared with an ordinary GaAs layer, and the defects diffuse up to a semiconductor layer thereabove, thus deteriorating response to a high frequency.

SUMMARY OF THE INVENTION

It is an object of the present invention to provide a method of manufacturing a compound semiconductor device in which a resistance value of a buffer layer is increased, a heterostructure of high quality with little deterioration of an active layer formed thereon is realized, and electrical characteristics of a semiconductor element formed in the heterostructure can be improved.

According to the present invention, a multilayer structure is formed by alternately depositing a multi-element compound semiconductor layer and a GaAs layer containing arsenic excessively deviating from a stoichiometric ratio repeatedly. According to such a structure, arsenic precipitates are formed in the GaAs layer, the size of each arsenic precipitate reaches approximately several ten Å, and Schottky barriers are generated between the arsenic precipitates and GaAs therearound. When the quantity thereof is increased, the Schottky barriers become to be joined together spatially, the conduction band of energy level in the GaAs layer is depleted, and the resistance becomes higher.

Further, by forming the GaAs layer in a critical film thickness or less, a strain of lattice mismatch is confined near the interface and the resistance is increased while maintaining the crystal of high quality even if the lattice constants of the GaAs layer is different from those of the multi-element compound semiconductor layer.

Furthermore, the GaAs layer is deposited alternately with the multi-element compound semiconductor layer repeatedly. Therefore, even when a defect is produced in the GaAs layer, the possibility that the defect is extended to a layer thereabove becomes very small due to the multilayer structure. As a result, deterioration of the characteristics of a device formed thereon is restrained.

With the foregoing, the side gate effect of the device formed on the film having a multilayer structure is reduced and the device characteristics are improved.

DESCRIPTION OF THE PREFERRED EMBODIMENTS

Prior to description of the embodiments, a molecular beam epitaxy apparatus (hereinafter referred to as an MBE apparatus) suitable for application thereto will be described.

Figure 1:
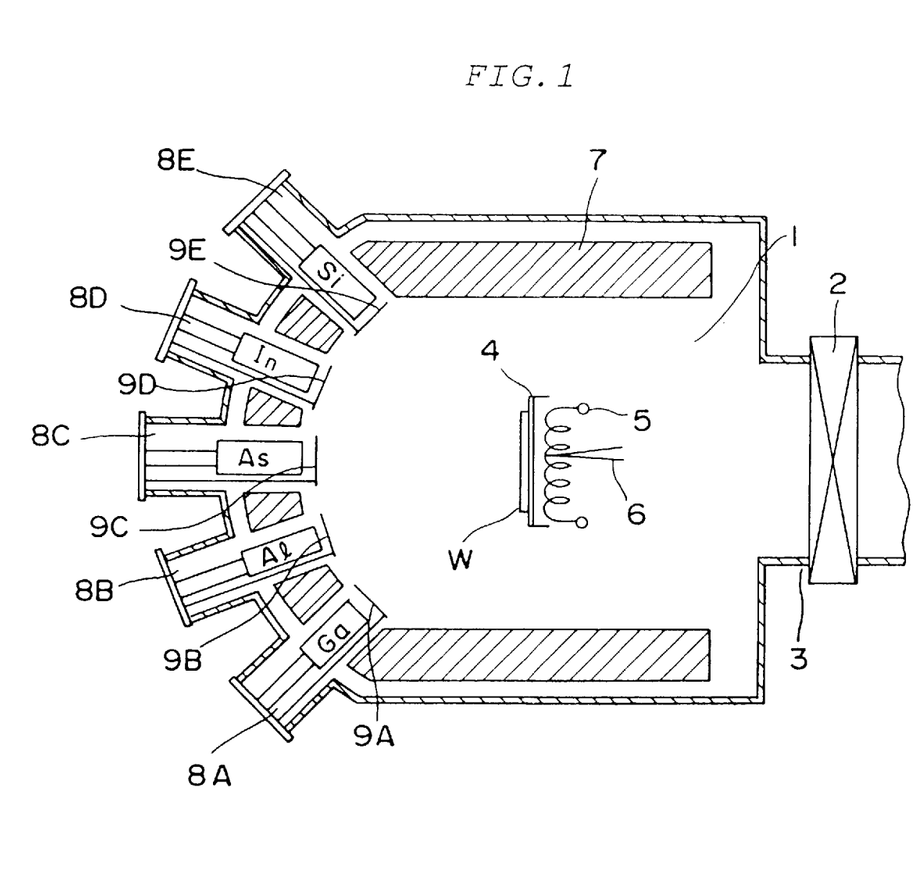
FIG. 1 is an explanatory diagram of a principal part for explaining an example of an MBE apparatus used in an embodiment of the present invention.

In FIG. 1, a reference numeral 1 represents a crystal growth chamber of an MBE apparatus, 2 represents a gate valve fitted to an exhaust system 3 of the crystal growth chamber 1, 4 represents a susceptor on which an article W in which a film is to be formed is mounted on one side thereof in the crystal growth chamber 1, 5 represents a heater arranged on the other side of the susceptor 4, 6 represents a thermocouple arranged for measuring a heating temperature of the heater 5, 7 represents a liquid nitrogen shroud fitted on an inter peripheral surface of the crystal growth chamber 1, 8A to 8E represent molecular beam source furnaces containing molecular beam source materials and radiating molecular beams to the article W on which a film is to be formed by heating these source materials, and 9A to 9E represent shutters provided on the molecular beam radiation sides of respective molecular beam source furnaces 8A to 8E.

The first molecular beam source furnace 8A contains gallium (Ga) and radiates a Ga molecular beam, the second molecular beam source furnace 8B contains an aluminum (Al) and radiates an Al molecular beam, the third molecular beam source furnace 8C contains an arsenic (As) and radiates an As molecular beam, the fourth molecular beam source furnace 8D contains an indium (In) and radiates an In molecular beam, and the fifth molecular beam source furnace 8E contains silicon (Si) and radiates a Si molecular beam.

(First Embodiment)

Figure 2A:
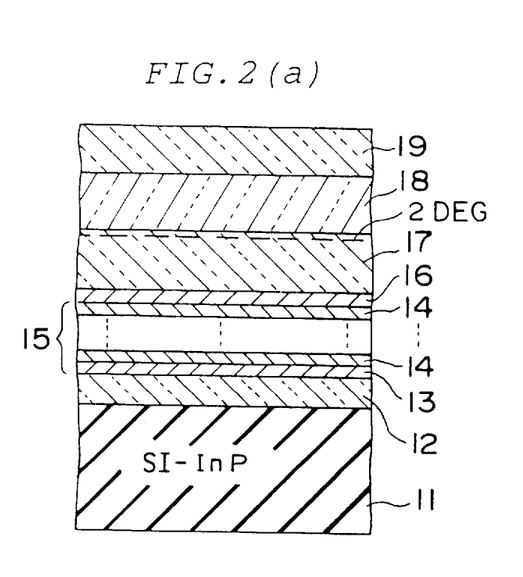
FIGS. 2(a) and 2(b) show sectional views showing a process of manufacturing a HEMT in a first embodiment of the present invention.
Figure 2B:
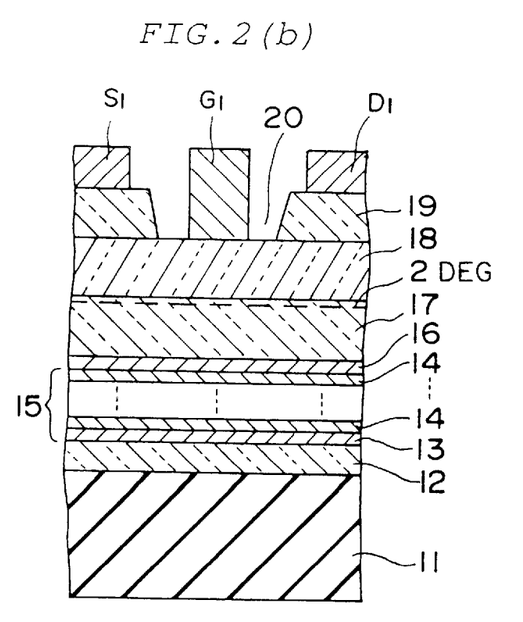

FIG. 2 shows sectional views for explaining a process of manufacturing a HEMT in a first embodiment of the present invention.

In the first place, a semi-insulating InP substrate 11 is used as an article W on which a film is to be formed, and it is installed on a susceptor 4 in a crystal growth chamber 1 of an MBE apparatus.

Next, when the temperature of the InP substrate 11 is set to 530° C. for instance by controlling the heating temperature of the heater 5, the shutter 9C of the third molecular beam source furnace 8C which radiates an As molecular beam is opened so as to radiate an arsenic molecular beam onto the InP substrate 11, and this state is maintained for ten minutes for instance, a natural oxide film on the surface of the InP substrate 11 is removed. Such surface processing is generally called thermal cleaning.

After the natural oxide film of the InP substrate 11 is removed as described above, a process of depositing a semiconductor film as shown in FIG. 2(a) is started.

First, the substrate temperature only is lowered from 530° C. to 500° C. while maintaining a state of radiating the As molecular beam used for thermal cleaning onto the InP substrate 11. Then, the shutter 9A of the first molecular beam source furnace 8A for Ga molecular beam radiation and the shutter 9D of the fourth molecular beam source furnace 8D for In molecular beam radiation are opened and these three types of molecular beams are radiated onto the surface of the InP substrate 11 while maintaining the temperature, thereby to grow a non-doped In$_y$Ga$_{1-y}$As (y=0.5) buffer layer 12 in a lattice match state in a thickness of approximately 200 nm on the substrate.

Then, after the shutters 9A and 9D of the first molecular beam source furnace 8A and the fourth molecular beam source furnace 8D are closed, the substrate temperature only is lowered to 300° C. or below, preferably to approximately 200° C. and the temperature is maintained while further maintaining the state of radiating the As molecular beam to the InP substrate 11, and furthermore, the shutter 9A of the first molecular beam source furnace 8A is opened again so as to radiate the Ga molecular beam. With this, a non-doped layer 13 is grown in a critical film thickness or less, e.g., in a thickness of approximately 10 nm for instance. The critical film thickness is a minimum film thickness in which a lattice mismatch state remains in a crystal without introducing crystal defects due to difference in lattice constants.

Next, the shutter 9D of the fourth molecular beam source furnace 8D is opened again, and a non-doped In$_y$Ga$_{1-y}$As (y-0.5) layer 14 having a thickness of approximately 10 nm is grown at a low temperature continuously on the GaAs layer 13.

Excessive As is taken into the GaAs layer 13 and the In$_y$Ga$_{1-y}$As layer 14 by low temperature growth.

Then, the GaAs layer 13 and the In$_y$Ga$_{1-y}$As layer 14 are grown repeatedly 20 cycles so as to form an InGaAs/GaAs layer 15 having a strain superlattice structure which becomes a buffer layer.

In the InGaAs/GaAs heterostructure, the GaAs layer has a small lattice constant as compared with the InGaAs layer, which causes to produce a lattice mismatch state at the interface therebetween. Since the thickness of the GaAs layer 13 is made to a critical film thickness or less, however, the strain in the lattice mismatch state is confined near the interface, thus presenting a crystal state of high quality in the InGaAs/GaAs layer 15.

Next, after growing a GaAs layer 16 having a thickness of approximately 10 nm at a low temperature on the uppermost $In_yGa_{1-y}As$ layer 14 among the InGaAs/GaAs layer 15, the shutter 9A of the Ga molecular beam source furnace 8A is closed, and the substrate temperature is raised from 200° C. to 500° C. while radiating the As molecular beam onto the surface of the GaAs layer 16. The temperature speed thereof is 2° to 3° C./sec. (120° to 180° C./minute), and temperature rise period of time is approximately two minutes.

As described above, simultaneously with starting of temperature rise of the substrate, the shutters 9A and 9D of the first and the fourth molecular beam source furnaces 8A and 8D are opened, and a non-doped $In_yGa_{1-y}As$ (y=0.5) active layer 17 which is also a buffer layer is grown in a thickness of approximately 100 nm. The growth speed is 0.3 nm/second, and the thickness of $In_yGa_{1-y}As$ which grows until the substrate temperature reaches 500° C. from 200° C. becomes approximately 36 nm.

Then, the shutter 9A of the first molecular beam source furnace 8A is closed, and the shutter 9B of the second molecular beam source furnace 8B for Al molecular beam radiation and the shutter 9E of the fifth molecular beam source furnace 8E for Si molecular beam radiation are opened at the same time, thereby to grow an n-InAlAs electron supply layer 18 doped with Si in a $1\times10^{18}/cm^3$ into a thickness of approximately 50 nm for instance.

Then, the shutter 9B of the second molecular beam source furnace 8B is closed and the shutter 9A of the first molecular beam source furnace 8A is opened at the same time so as to radiate Ga, thereby to grow an InGaAs cap layer 19 having a thickness of approximately 100 nm for instance doped with silicon in impurity concentration of approximately $1\times10^{18}/cm^3$.

In a state that respective semiconductor layers 12 to 19 are deposited as described above, 2DEG is generated on the side of the active layer 17 at the interface between the active layer 17 and the electron supply layer 18.

Now, while the active layer 17, the electron supply layer 18 and the cap layer 19 are being deposited at a high temperature of 500° C., the non-doped GaAs layer 13 is annealed at that temperature, and As contained excessively deviating from a stoichiometric ratio is precipitated therein to form crystal grains.

Figure 3A:
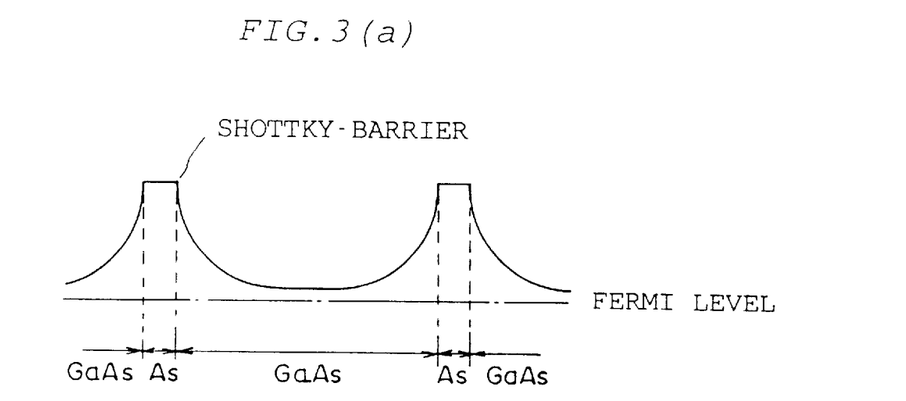
FIGS. 3(a) and 3(b) show energy band diagrams in a conduction band of a GaAs layer containing arsenic excessively in a GaAs/In$_y$Ga$_{1-y}$As layer in the first embodiment of the present invention.
Figure 3B:
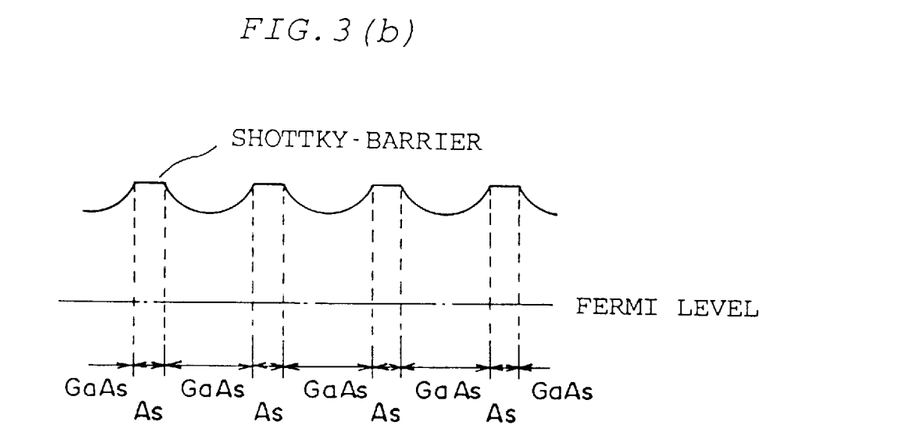

Then, the size of each arsenic precipitate reaches approximately several nm, and Schottky barriers are produced at interfaces between arsenic metal particles and GaAs regions therearound as shown in FIG. 3(a) in the GaAs layer 13. When the density reaches approximately $1\times10^{18}/cm^3$, the Schottky barriers are joined together spatially and spread in the GaAs crystal, and the conduction band of the GaAs layer 13 is depleted completely to become a high resistance layer as shown in FIG. 3(b).

When the sheet resistance of the InGaAs/GaAs layer 15 having the strain heterostructure was measured, a value of $1\times10^8$ Ω/cm² or higher has been obtained.

Further, in a GaAs layer containing arsenic excessively, crystal defects are liable to be produced at the interface between the As precipitates and the GaAs region as compared with a GaAs layer which is not so. In the present embodiment, however, the GaAs 13 containing arsenic excessively is put between $In_yGa_{1-y}As$ layers 14 so as to form a superlattice structure. Therefore, even when crystal defects are produced, the defects are interrupted at the interface with the $In_yGa_{1-y}As$ layer 14 and do not diffuse further to the upper layer.

With this, it becomes possible to form a high resistance buffer layer in which no crystal defects are generated.

After the process of depositing a compound semiconductor film as described above is completed, the InP substrate 11 is taken out of the MBE apparatus and applied with a resist process in ordinary photolithography techniques, thereby to form a recess structure 20 in a gate region and a source electrode $S_1$ and a drain electrode $D_1$ on the cap layer 19 on both sides thereof as shown in FIG. 2(b). AuGe/Au is available as the material of these electrodes.

Further, after alloying processing or the like for forming ohmic contact of the source electrode $S_1$ and the drain electrode $D_1$ with the 2DEG layer is performed, a HEMT is completed when a gate electrode $G_1$ composed of WSi or the like is brought into Schottky contact with the top of the electron supply layer 18 exposed from the recess structure 20.

When the side gate effect of the HEMT thus completed was measured, the side gate voltage is shown at 20 V, and the variation of the threshold voltage of the HEMT was 0 mV which was good even when the distance between adjacent FET gate electrodes is approximately 10 μm.

This is because of such a reason that the InGaAs/GaAs layer 15 having a strain superlattice structure becomes to have a high resistance, and the film quality is high.

Moreover, since defects by excessive arsenic becomes harder to diffuse to a channel region in the upper layer, high frequency characteristics are improved.

Besides, a model of a phenomenon in case only one layer of GaAs layer containing arsenic excessively is introduced in the following document for instance.

⑤ A. C. Warren et al. "Arsenic precipitates and the semi-insulating properties of GaAs buffer layers grown by low temperature molecular beam epitaxy", Appl. Phys. Lett. 57(1990) 1331.

When a high resolution section TEM was also observed as regards a sample of the GaAs/InGaAs layer 15 having a strain superlattice structure in the present embodiment, it has been confirmed that arsenic precipitates were formed in the GaAs layer 13 in particular.

(Second Embodiment)

Figure 4A:
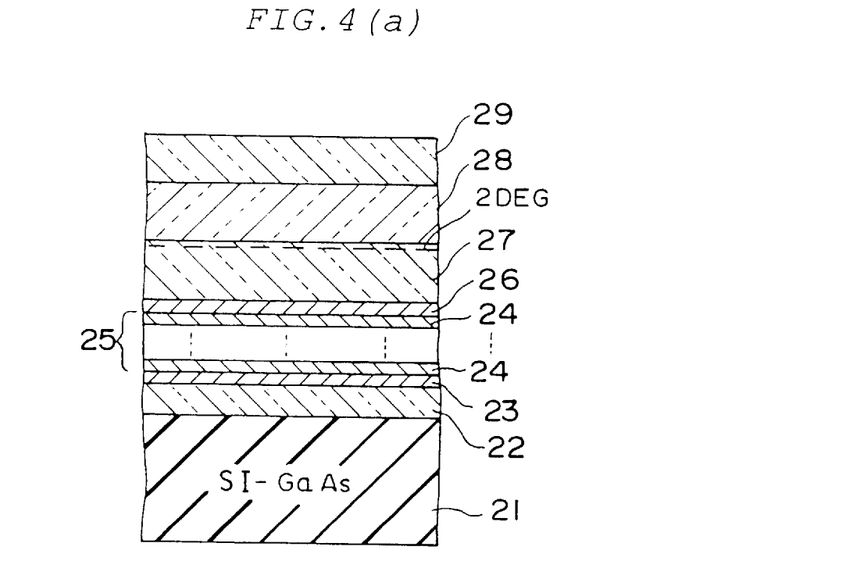
FIGS. 4(a) and 4(b) show sectional views showing a process of manufacturing a HEMT in a second embodiment of the present invention.
Figure 4B:
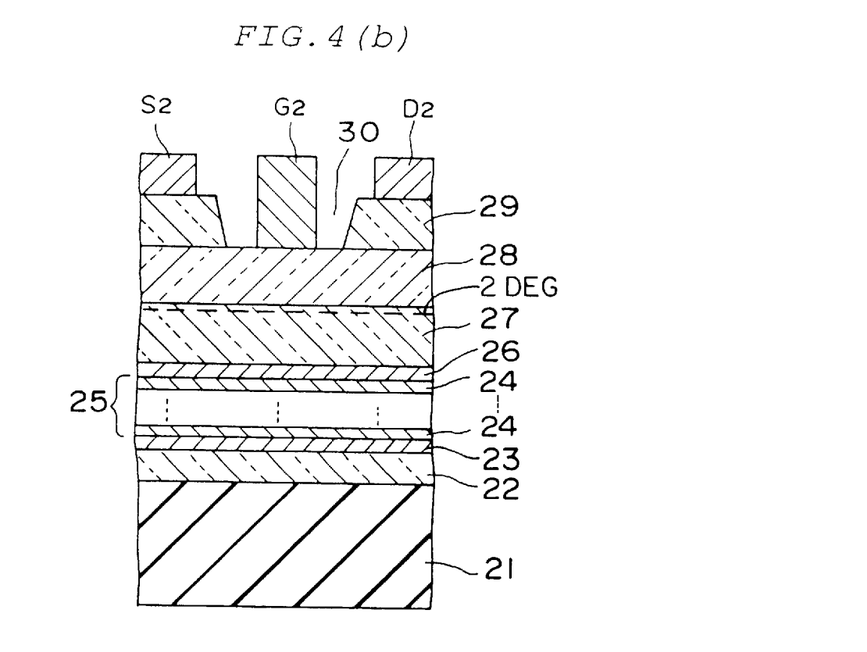
Figure 5:
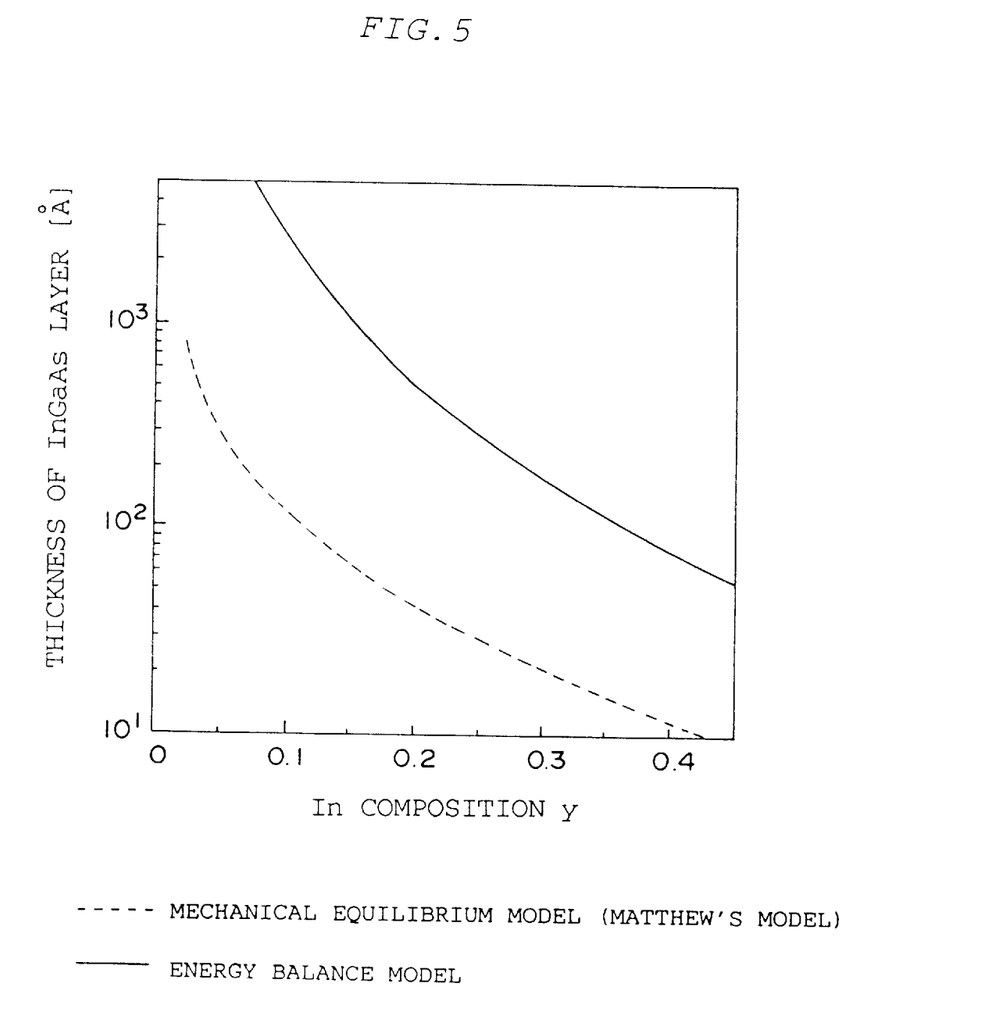
FIG. 5 is a diagram showing an example of the relationship between a critical layer thickness and In composition y of an InGaAs layer having a GaAs/In$_y$Ga$_{1-y}$As/GaAs heterostructure in the second embodiment of the present invention.

FIG. 4 shows sectional views showing a process of forming a HEMT of a second embodiment of the present invention.

First, a semi-insulating GaAs substrate 21 is installed on the susceptor 4 of the crystal growth chamber 1 in the MBE apparatus, the shutter 9C of the As molecular beam source furnace 8C is opened, a temperature of the GaAs substrate 21 is raised to 630° C. for instance while radiating the As molecular beam, and such a state is maintained for 10 minutes for instance, thereby to perform thermal cleaning so as to remove a natural oxide film on the surface of the GaAs substrate 21.

After the natural oxide film of the GaAs substrate 21 is removed as described above, a process of depositing a semiconductor film having a multilayer structure as shown in FIG. 4(a) is started.

After thermal cleaning described above, the substrate temperature only is lowered from 630° C. to 500° C. while maintaining the state of radiating the As molecular beam onto the GaAs substrate 21.

Then, the temperature is maintained, the shutter 9A of the Ga molecular beam source furnace 8A is opened, and a non-doped GaAs buffer layer 22 in a lattice match state having a thickness of approximately 200nm is grown.

Next, after the shutter 9A of the Ga molecular beam source furnace 8A is closed, the substrate temperature only is lowered down to 300° C. or lower, preferably to approximately 200° C. and maintained at that level while maintaining the state of radiating the As molecular beam onto the GaAs substrate 21. In succession, the shutter 9A of the Ga molecular beam source furnace 8A and the shutter 9D of the In molecular beam source furnace 8D are opened, and a non-doped $In_yGa_{1-y}As$ layer 23 (y–0.5) is deposited in a thickness of a critical film thickness or less, e.g., in a thickness of 10 nm.

Then, the shutter 9D of the In molecular beam source furnace 8D is closed, and a non-doped GaAs layer 24 is grown in a critical film thickness or less, e.g., in a thickness of 10 nm.

Excessive arsenic has been taken into these $In_yGa_{1-y}As$ layer 23 and GaAs layer 24 by growth at a low temperature similarly to the first embodiment. These $In_yGa_{1-y}As$ layer 23 and GaAs layer 24 are grown 20 cycles, thereby to form a GaAs/InGaAs layer 25 having a strain superlattice structure which becomes a buffer layer.

In this case, an InAs composition y of the $In_yGa_{1-y}As$ layer 23 formed every other layer into 20 layers in total is all made constant at 0.5. However, it is also possible to deposite the $In_yGa_{1-y}As$ layer 23 further so as to reach 0.5 in the 20th layer by increasing y in a step form at a pitch of 0.025 in such a manner that the InAs composition ratio of the first layer is set to y=0.025, that of the second layer is set to 0.05 and that of the third layer is set to 0.075, or to increase the composition y in a gradient form from 0.025 to 0.5 every time the number of layers and the total thickness of the $In_yGa_{1-y}As$ layer 23 are increased.

According to a method of growing a multilayer strain superlattice structure while increasing the composition ratio y from a low value to a higher value of approximately 0.5, it becomes easier to make the thickness thinner so as to relieve the strain as compared with a method of growing a multilayer strain structure by setting a constant high value of y=0.5 from the beginning.

After a GaAs/InGaAs strain layer 25 is grown as described above, a GaAs layer 26 is formed thereon in a thickness of several nm, the shutter 9A of the Ga molecular beam source furnace 8A is closed, and the substrate temperature is raised from 200° C. to 500° C. while radiating the As molecular beam onto the surface of the GaAs layer 26. The temperature rise period of time is set to 2 to 3° C./second (120° to 180° C./minute) similarly to the first embodiment.

Next, simultaneously with starting to raise the substrate temperature, the shutters 9A and 9D of the Ga molecular beam source furnace 8A and the In molecular beam source furnace 8D are opened, and a non-doped $In_yGa_{1-y}As$ (y=0.5) active layer 27 which is also a buffer layer is grown in a thickness f approximately 100 nm for instance.

The growth speed is 0.3 nm/second, and the thickness of the InGaAs layer 25 which grows while the substrate temperature rises from 200° C. to 500° C. reaches approximately 36 nm.

After the active layer 27 is grown, the electron beam source furnaces are selected by the shutters so as to deposit an n-InAlAs layer 28 and an n-InGaAs layer 29, and then, a recess structure 30, a gate electrode $G_2$, a source electrode $S_2$ and a drain electrode $D_2$ are formed by a process exactly the same as that described in the first embodiment, thus completing a HEMT such as shown in FIG. 4(b).

In the HEMT thus completed, arsenic is contained excessively in the GaAs layer 24 in the GaAs/InGaAs layer 25 having a superlattice structure similarly to the result of the first embodiment, and a depletion layer is spread by Schottky barriers at the interface between the arsenic metal gains generated in that layer and the GaAs region, thus making the resistance higher.

Moreover, crystal defects are hardly transmitted to the upper layer, and the high frequency characteristics will neither be deteriorated.

With this, both the side gate effect and the sheet resistance of the buffer showed satisfactory results in a semiconductor device having a HEMT shown in FIG. 4(b).

Besides, a critical film thickness of $In_yGa_{1-y}As$ having a heterostructure putting $In_yGa_{1-y}As$ therebetween by GaAs which does not contain arsenic excessively has been reported in the Institute of Electronics and Communications, ⑥ Technical Report and Research, ED 88–94(1988), pp. 9 to 14.

(Third Embodiment)

Figure 6A:
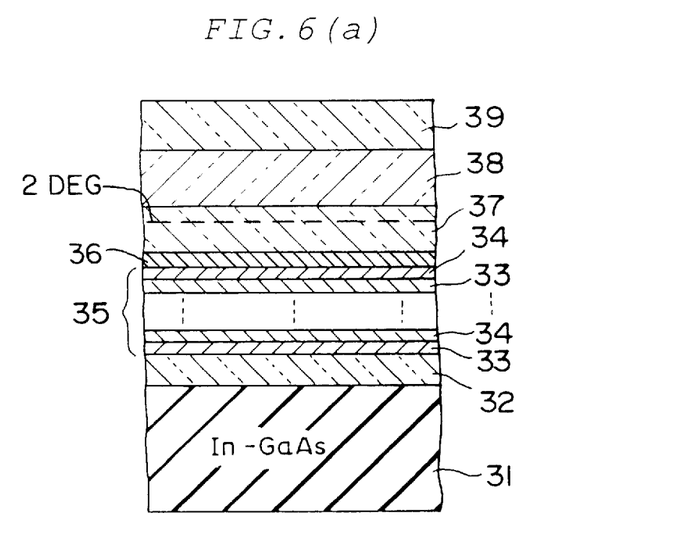
FIGS. 6(a) and 6(b) show sectional views showing a process of manufacturing a HEMT in a third embodiment of the present invention.
Figure 6B:
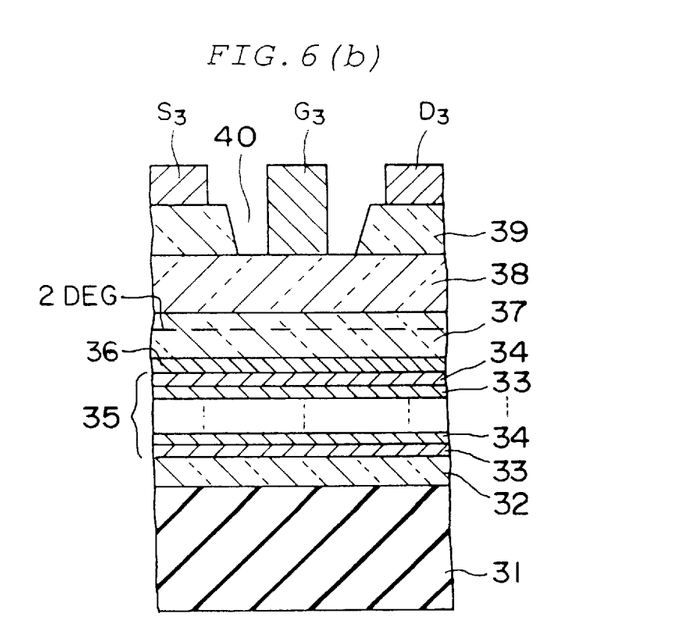

FIG. 6 shows sectional views of a process of forming a HEMT in a third embodiment of the present invention.

First, a semi-insulating GaAs substrate 31 is installed on the susceptor 4 of the crystal growth chamber 1 of the MBE apparatus, the shutter 9C of the As molecular beam source furnace 8C is opened so as to radiate the As molecular beam, and a natural oxide film on the surface of the GaAs substrate 31 is removed by a thermal cleaning method similar to that in the second embodiment.

After the natural oxide film on the GaAs substrate 31 is removed as described above, a process of depositing a semiconductor layer having a multilayer structure as shown in FIG. 6(a) is started.

First, the substrate temperature only is lowered from 630° C. to 500° C. while maintaining the state of radiating the As molecular beam onto the GaAs substrate 31.

Then, that temperature is maintained, and the shutter 9A of the Ga molecular beam source furnace 8A is opened, thereby to grow a non-doped GaAs buffer layer 32 in lattice match state having a thickness of approximately 200 nm.

Next, after the shutter 9A of the Ga molecular beam source furnace 8A is closed, the substrate temperature only is lowered to 300° C. or below, preferably to approximately 200° C. and this temperature is maintained while maintaining the state of radiating the As molecular beam. Then, the shutters 9A and 9B of the first molecular beam source furnace 8A and the second molecular beam source furnace 8B are opened so as to radiate molecular beams of the Ga and Al onto the GaAs buffer layer 32, thereby to deposite a non-doped AlGaAs layer 33 thereon in a thickness of approximately 10 nm. Then, the shutter 9B of the Al molecular beam source furnace 8B is closed so as to grow a non-doped GaAs layer 34 having a thickness of approximately 10 nm.

As described, opening and closing of the shutter 9B of the Al molecular beam source furnace 8B are repeated 20 cycles, thereby to form a GaAs/AlGaAs layer 35 having a superlattice structure which becomes a buffer layer.

In succession, an AlGaAs layer 36 is deposited in a thickness of 10 nm on the GaAs/AlGaAs layer 35, then the shutter 9B of the Al molecular beam source furnace 8B is closed, and the substrate temperature is raised from 200° C. to 500° C. while radiating the As molecular beam and the Ga molecular beam onto the surface of the AlGaAs layer 36. The temperature rise period of time is set to 2° to 3° C./second (120° to 180° C./minute) similarly to the first embodiment.

Then, the As molecular beam and the Ga molecular beam are radiated further after temperature rise, thereby to grow a non-doped GaAs active layer 37 in a thickness of approximately 100 nm for instance.

Then, respective shutters 9B and 9E of the Al molecular beam source furnace 8B and the Si molecular beam source furnace 8E are opened, and an AlGaAs electron supply layer 38 doped with Si at $1\times10^{18}/cm^{-3}$ for instance is formed in a thickness of approximately 50 nm. In this instance, a two-dimensional electron gas 2DEG is generated between the active layer 37 and the electron supply layer 38 in the same manner as in the first and the second embodiment.

Then, when the shutter 9B of the Al molecular beam source furnace 8B is closed and a GaAs contact layer 39 doped with Si at $1\times10^{18}/cm^3$ for instance is formed in a thickness of approximately 100 nm, such a state as shown in FIG. 6(a) is formed.

Thereafter, the GaAs substrate 31 is taken out of the MBE apparatus, and a resist process in ordinary photolithography techniques is applied similarly to the above-described two embodiments. Thus, when a recess structure 40 in a gate region is formed, a source electrode $S_3$ and a drain electrode $D_3$ etc. are formed, alloying processing and so on for obtaining contact of these electrodes with the 2DEG layer are performed, and a gate electrode $G_3$ is formed thereafter, a HEMT having a sectional structure shown in FIG. 6(b) is completed.

In the HEMT thus completed, excessive arsenic is taken into the GaAs layer 34 by growth at a low temperature similarly to the embodiments described previously. With this, the GaAs/AlGaAs buffer layer 35 grown at a low temperature has a high resistance. And similarly to the result of the first embodiment, satisfactory results were obtained both for the side gate effect and the buffer sheet resistance.

Now, the reason why the superlattice structures have been adopted for GaAs and AlGaAs in a good lattice match state with respect to the GaAs substrate 31 in the present embodiment is as follows.

Namely, when only one GaAs layer containing excessive arsenic is formed thick and used as a buffer layer, there is such a problem that crystal defects are diffused to a channel layer thereabove, thereby to deteriorate high frequency characteristics when dislocation is generated at the interface between As precipitates and GaAs in that GaAs layer.

As against the above, it has been confirmed that, when a buffer layer having a superlattice structure of GaAs/AlGaAs as described previously is formed, the propagation of crystal defects thereof comes to a stop within the GaAs/AlGaAs layer even if defects are produced by arsenic precipitates, which is effective for the improvement of high frequency characteristics.

(Other Embodiments)

In the above-described embodiment, a low temperature growth method for executing the growth while maintaining the substrate temperature at 300° C. or below has been adopted in order to form a GaAs layer containing arsenic excessively, but the GaAs layer can also be grown without lowering the temperature in accordance with the following method.

Namely, two sets of As molecular beam source furnaces are prepared in the MBE apparatus shown in FIG. 1. Then, when a shutter of a second As molecular beam source furnace not illustrated is opened while keeping the substrate temperature at 500° C. as it is and excessive arsenic molecular beams are applied onto the substrate after the InGaAs buffer layer 12 or GaAs buffer layers 22 and 32 are grown in the first to the third embodiments, a GaAs layer containing arsenic excessively is formed.

In this case, the intensity of an arsenic molecular beam of a furnace which becomes the second As molecular beam source is required to be approximately 5 to 10 times thereof as compared with the first arsenic molecular beam source furnace. The intensity is controlled by the heating temperature in the furnace.

Incidentally, a HEMT was formed on the InGaAs/GaAs layers 15 and 25 or the GaAs/AlGaAs layer 35 having superlattice structures in the above-described embodiments, but a Schottky gate field effect transistor (MESFET) or an insulating gate field effect transistor (MISFET) may also be formed, thereby to restrain the side gate effect and improve transistor characteristics.

What is claimed is:

1. A compound semiconductor device comprising:
   a compound semiconductor substrate: and
   a first buffer layer formed above the compound semiconductor substrate, said first buffer layer having a high resistance layer of a superlattice structure obtained by alternately and repeatedly depositing a first multi-element compound semiconductor layer and a GaAs layer including arsenic excessively deviating from a stoichiometric ratio above the compound semiconductor substrate, and said first buffer layer having an active layer formed above said high resistance layer, said active layer having a channel region in a vicinity of an upper surface thereof,
   wherein a mixed crystal ratio of said first multi-element compound semiconductor layer is made to change in a step form every time the number of layers are increased.

2. A compound semiconductor device comprising:
   a compound semiconductor substrate; and
   a first buffer layer formed above the compound semiconductor substrate, said first buffer layer having a high resistance layer of a superlattice structure obtained by alternately and repeatedly depositing a first multi-element compound semiconductor layer and a GaAs layer including arsenic excessively deviating from a stoichiometric ratio above the compound semiconductor substrate, and said first buffer layer having an active layer formed above said high resistance layer, said active layer having a channel region in a vicinity of an upper surface thereof,
   wherein said GaAs layer and said first multi-element compound semiconductor layer in said high resistance layer have lattice constants different from each other and form a strained heterostructure,
   wherein a mixed crystal ratio of said first multi-element compound semiconductor layer is made to change in a step form every time the number of layers are increased.

3. A compound semiconductor device comprising:

a compound semiconductor substrate; and a first buffer layer formed above the compound semiconductor substrate, said first buffer layer having a high resistance layer of a superlattice structure obtained by alternately and repeatedly depositing a first multi-element compound semiconductor layer and a GaAs layer including arsenic excessively deviating from a stoichiometric ratio above the compound semiconductor substrate, and said first buffer layer having an active layer formed above said high resistance layer, said active layer having a channel region in a vicinity of an upper surface thereof, wherein in said high resistance layer, said first multi-element compound semiconductor layer has a lattice match state with said compound semiconductor substrate;

said GaAs layer has a lattice mismatch state with said compound semiconductor substrate and said first multi-element compound semiconductor layer; and said GaAs layer and said first multi-element compound semiconductor layer form a strained heterostructure.

4. A compound semiconductor device according to claim 3, wherein said GaAs layer is grown to a thickness being less than or equal to a critical thickness on said first multi-element compound semiconductor layer.

5. A compound semiconductor device according to claim 3, wherein a mixed crystal ratio of said first multi-element compound semiconductor layer is made to change in a step form every time the number of layers are increased.

6. A compound semiconductor device according to claim 3, wherein a mixed crystal ratio of said first multi-element compound semiconductor layer in said high resistance layer is made to change in a gradient form every time the number of layers are increased.

7. A compound semiconductor device comprising:

a buffer layer having a multilayer structure formed by alternately and repeatedly depositing an InGaAs layer having a lattice match state with an InP substrate and a GaAs layer containing arsenic excessively deviating from a stoichiometric ratio and having a thickness less than or equal to a critical thickness above said InP substrate;

an active layer of InGaAs formed above said buffer layer; and a carrier supply layer formed on said InGaAs active layer and including InAlAs in a lattice match state with said InGaAs active layer, a channel region being formed at an interface between said InGaAs active layer and said carrier supply layer.

8. A compound semiconductor device comprising:

a buffer layer having a multilayer structure formed by alternately and repeatedly depositing a GaAs layer grown to a thickness being less than or equal to a critical thickness and containing arsenic excessively deviating from a stoichiometric ratio and an InGaAs layer grown to a thickness being less than or equal to a critical thickness above a GaAs substrate;

an active layer of InGaAs formed above said buffer layer; and a carrier supply layer formed on said InGaAs active layer and including InAlAs in a lattice match state with said active layer, a channel region being formed at an interface between said InGaAs active layer and said carrier supply layer.

9. A compound semiconductor device comprising:

a compound semiconductor substrate; and a first buffer layer formed above the compound semiconductor substrate, said first buffer layer having a high resistance layer of a superlattice structure obtained by alternately and repeatedly depositing a first multi-element compound semiconductor layer and a GaAs layer including arsenic excessively deviating from a stoichiometric ratio above the compound semiconductor substrate, and said first buffer layer having an active layer formed above said high resistance layer, said active layer having a channel region in a vicinity of an upper surface thereof, wherein a mixed crystal ratio of said first multi-element compound semiconductor layer in said high resistance layer is made to change in a gradient form every time the number of layers are increased.

10. A compound semiconductor device, comprising:

a compound semiconductor substrate; and a first buffer layer formed above the compound semiconductor substrate, said first buffer layer having a high resistance layer of a superlattice structure obtained by alternately and repeatedly depositing a first multi-element compound semiconductor layer and a GaAs layer including arsenic excessively deviating from a stoichiometric ratio above the compound semiconductor substrate, and said first buffer layer having an active layer formed above said high resistance layer, said active layer having a channel region in a vicinity of an upper surface thereof, wherein said GaAs layer and said first multi-element compound semiconductor layer in said high resistance layer have lattice constants different from each other and form a strained heterostructure, wherein a mixed crystal ratio of said first multi-element compound semiconductor layer in said high resistance layer is made to change in a gradient form every time the number of layers are increased.

* * * * *